United States Patent
Suzuki et al.

(10) Patent No.: US 7,563,379 B2
(45) Date of Patent: Jul. 21, 2009

(54) DRY ETCHING METHOD AND PHOTONIC CRYSTAL DEVICE FABRICATED BY USE OF THE SAME

(75) Inventors: Akiko Suzuki, Akishima (JP); Akinobu Sato, Soka (JP); Emmanuel Bourelle, Tachikawa (JP); Jiro Matsuo, Kyoto (JP); Toshio Seki, Kyoto (JP); Takaaki Aoki, Kyoto (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 172 days.

(21) Appl. No.: 11/008,606

(22) Filed: Dec. 8, 2004

(65) Prior Publication Data

US 2005/0155951 A1    Jul. 21, 2005

(30) Foreign Application Priority Data

Dec. 15, 2003    (JP) ............................. 2003-416438

(51) Int. Cl.
*H01L 21/302*    (2006.01)
(52) U.S. Cl. .............................. 216/2; 216/41; 216/46; 216/58; 216/66; 438/695; 438/706
(58) Field of Classification Search .................... 216/66
See application file for complete search history.

(56) References Cited

U.S. PATENT DOCUMENTS

| 6,207,282 | B1* | 3/2001 | Deguchi et al. ............. 428/408 |
| 6,805,807 | B2* | 10/2004 | Fenner ......................... 216/38 |
| 7,022,545 | B2* | 4/2006 | Yamada et al. .............. 438/105 |
| 7,071,122 | B2* | 7/2006 | Saenger et al. ............. 438/778 |
| 7,115,511 | B2* | 10/2006 | Hautala ....................... 438/689 |
| 2002/0006726 | A1* | 1/2002 | Yamasaki et al. ........... 438/689 |
| 2003/0073314 | A1 | 4/2003 | Skinner et al. |
| 2004/0157456 | A1* | 8/2004 | Hall et al. ................... 438/692 |

(Continued)

FOREIGN PATENT DOCUMENTS

JP    61210615 A   *   9/1986

(Continued)

OTHER PUBLICATIONS

Yamada, I., "Novel materials processing and applications by gas cluster ion beams" The European Physical Journal D, 9, 55-61, 1999.*

(Continued)

*Primary Examiner*—Anita K Alanko
(74) *Attorney, Agent, or Firm*—David N. Lathrop, Esq.; Gallagher & Lathrop (57) ABSTRACT

In a dry etching method in which clusters formed by agglomeration of atoms or molecules are ionized and accelerated as a cluster ion beam for irradiation of an object surface to etch away therefrom its constituent atoms, the clusters are mixed clusters 42 formed by agglomeration of two or more kinds of atoms or molecules, and the mixed clusters 42 contain atoms 43 of at least one of argon, neon, xenon and krypton, and a component 44 that is deposited on the object surface to form a thin film by reaction therewith. With this method, it is possible to provide an extremely reduced sidewall surface roughness and high vertical machining accuracy.

16 Claims, 10 Drawing Sheets

U.S. PATENT DOCUMENTS

2006/0060559 A1* 3/2006 Fang et al. .................. 216/22

FOREIGN PATENT DOCUMENTS

| JP | 03-163825 | 7/1991 |
| JP | 05-102083 | 4/1993 |
| JP | 06-224156 | 8/1994 |
| JP | 06-349784 | 12/1994 |
| JP | 08-120470 | 5/1996 |
| JP | 09-082691 | 3/1997 |
| JP | 10-135192 | 5/1998 |
| JP | 2005062664 A * | 3/2005 |
| WO | WO 02/05315 A2 | 1/2002 |

OTHER PUBLICATIONS

Bourelle, Emmanuel et al, "Polishing of Sidewall Surfaces Using a Gas Cluster Ion Beam" Japanese Journal of Applied Physics, vol. 43, No. 10A, pp. L1253-L1255, 2004.*

Matsuo, Jiro et al "Nanofabrication technology by gas cluster ion beams" JVST B 14 (6) pp. 3951-3954, Nov./Dec. 1996.*

Sangyo Tosho, © Takashi Tokuyama 1992; ISBN 4-7828-5628-8 C 3055, pp. 64-66.

* cited by examiner

P1 : SIDEWALL PROTECTIVE FILM FORMATION

P2 : ETCHING

P3 : ETCHING PROFILE

PRESENT INVENTION     CONVENTIONAL METHOD 1     CONVENTIONAL METHOD 2

DRY ETCHING METHOD AND PHOTONIC CRYSTAL DEVICE FABRICATED BY USE OF THE SAME

BACKGROUND OF THE INVENTION

The present invention relates to a dry etching method for use in the field of microfabrication and, more particularly, to a dry etching method for high-precision microfabrication of a miniature structure of the submicron order with a high aspect ratio and with low surface roughness. The invention also pertains to a photonic crystal device fabricated by use of such a dry etching method.

In the field of microfabrication for integrated circuits and MEMS (Micro-Electro-Mechanical-System) devices there is a growing need for the technique to microfabricate a structure of the submicron order with a high aspect ratio. Furthermore, it is pointed out in the art that the surface roughness of the microfabricated device structure, for example, the surface roughness of its bottom and sidewalls determines the device performance; hence, there is an earnest desire for reduction of the surface roughness. At present, it is customary in the art to fabricate such microminiature devices by use of such dry etching methods as plasma etching using reactive plasma and ion milling that irradiates a specimen or workpiece with a monomer ion such as $Ar^+$. In particular, the reactive plasma etching is excellent in performance and in cost-performance, and for this reason it is currently the mainstream of microfabrication.

With a view to minimizing damage to the specimen, there is proposed an etching method using a gas cluster ion beam. This is a method that irradiates the specimen with ionized clusters formed by the agglomeration of gas molecules, and it is known that this method permits minimization of damage to the specimen since the charge or energy of the ionized clusters is very small in terms of incident atoms. For example, in the case of accelerating an $Ar^+$ monomer ion and an Ar cluster ion composed of 1000 atoms with a 1-kV voltage, the kinetic energy per atom in the irradiation of a specimen substrate with the Ar cluster ion is as low as 1 eV, so that it is harder for the Ar cluster ion to penetrate into and hence cause damage to the specimen than in the case of the $Ar^+$ monomer ion. Besides, since the amount of charge is small as compared with the number of atoms that contribute to etching, the irradiation with the Ar cluster ion achieves a high etching ratio while getting around such problems as charging of the substrate and dielectric breakdown of an element containing an insulating structure.

Prior art examples that use such cluster ion beam for etching are disclosed in Japanese Patent Kokai publications Nos. H03-163825 (published Jul. 15, 1991, hereinafter referred to as Document 1) and H05-102083 (published Apr. 23, 1993, hereinafter referred to as Document 2). In Document 1 there is set forth an example that uses cluster ion beam etching for the purpose of minimizing damage to the surface of a specimen (a silicon substrate) by irradiation with the beam and performs etching the silicon substrate by irradiating it with the Ar cluster ion beam in a $Cl_2$ gas atmosphere. In Document 2 there is disclosed an example using the cluster ion beam etching as a solution to the problems attendant with the plasma etching, such as irradiation damage to the specimen surface and etching profile abnormalities caused by the deflection of the incident ion beam due to charging of the specimen. In Document 2 it is pointed out that when a silicon substrate having its surface covered with a mask as of $SiO_2$ was etched by $Cl_2$ gas, there was not observed a tapered etching profile considered to be caused by charging of the substrate.

In plasma etching, there is known a technique called "sidewall protection" that permits vertical etching even if the incident angle of the ion beam to the specimen surface is distributed (e.g., Hajime Tokuyama, "Semiconductor Dry Etching Techniques," Sangyoh Tosho, pp. 64-66, Oct. 6, 1992, hereinafter referred to as Document 3). For example, in the case of etching a silicon substrate by the plasma etching scheme using the $Cl_2$ gas alone, sidewalls of the groove are hollowed out by some components of the plasma ion which are incident on the silicon substrate at some angles thereto, but the addition of $CHF_3$ to the $Cl_2$ implements vertical etching without hollowing out the sidewalls of the groove. This is explained to be due to the formation of $CHF_3$-polymerized films on the sidewalls which resist etching by the diagonally incident ions. Thus, in the field of plasma etching it is well-known that vertical etching can be achieved by the combined use of the etching gas and the gas capable of forming the sidewall protective film. An example of this sidewall protection is also disclosed in Japanese Patent Kokai Publication No. H06-349784 (published Dec. 22, 1994, hereinafter referred to as Document 4).

In Japanese Patent Kokai Publication No. H10-135192 (published May 22, 1998, hereinafter referred to as Document 5) there is disclosed a plasma etching method in which an etching gas as of $SF_6$ and a passive gas for forming the sidewall protective film, such as $CHF_3$, are not mixed but instead they are used alternately with each other. This is a method generally called Bosch process, which provides excellent verticality of sidewalls and ensures implementation of a high aspect ratio. Furthermore, in Japanese Patent Application Kokai Publication No. H09-082691 (published Mar. 28, 1997, hereinafter referred to as Document 6) there is disclosed another conventional method which performs etching while at the same time protecting sidewalls. With this method, during etching at least one of the product resulting from the reaction between a material being etched and a halogen-based gas and a re-dissociation product of the reaction product is deposited on the material subject to etching. This method permits efficient deposition of a protective film on the sidewall near the part being etched.

In recent years, a method for planarizing or flattening the workpiece surface by use of a gas cluster ion beam has come to industry attention because it reduces damage to the workpiece surface and the surface roughness. For example, in Japanese Patent Kokai Publication No. H08-120470 (published May 14, 1996, hereinafter referred to as Document 7) there is described a method for reducing the surface roughness by irradiating the workpiece surface with the gas cluster ion beam. With this method, the gas cluster ion applied to the workpiece is broken up into particles by its collision with the workpiece, and at this time a multibody collision occurs between cluster forming atoms or molecules and workpiece forming atoms or molecules, by which the particles are drive hard in a direction parallel to the workpiece surface—this permits cutting in a direction lateral or parallel to the workpiece surface. This is a phenomenon called "lateral sputtering," in which surface protrusions or convexities are cut away by movements of the particles across the workpiece surface to achieve its ultraprecision polishing on the order of atomic size. Since the energy of the ion of the gas cluster ion beam is far lower than in ordinary ion etching, such ultraprecision polishing can be done without damaging the workpiece surface.

In the surface planarization by use of the gas cluster ion beam, it is generally recognized that the gas cluster ion beam may preferably be incident on the workpiece substantially at right angles to the surface thereof. This is intended to make utmost use of the effect of surface smoothing by the above-mentioned "lateral sputtering."

Figure 1:
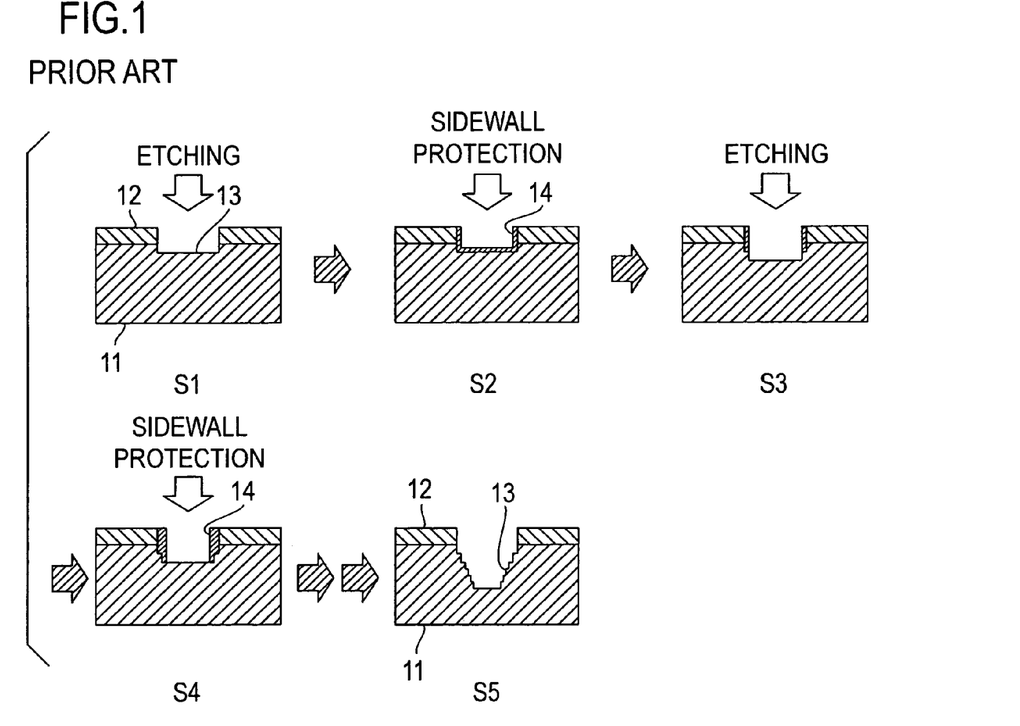
FIG. 1 shows in section a sequence of steps involved in a conventional etching method that combines an ion beam etching and a sidewall protection scheme.
Figure 2A:
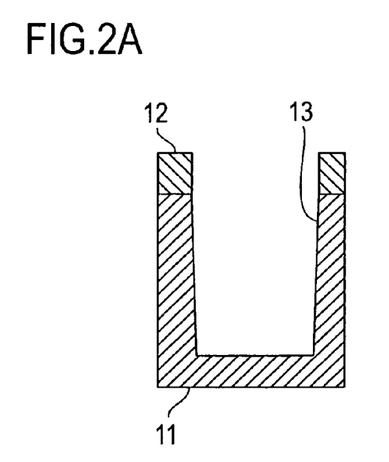
FIG. 2A is a sectional view showing the etching profile of a low aspect ratio by the method of FIG. 1.
Figure 2B:
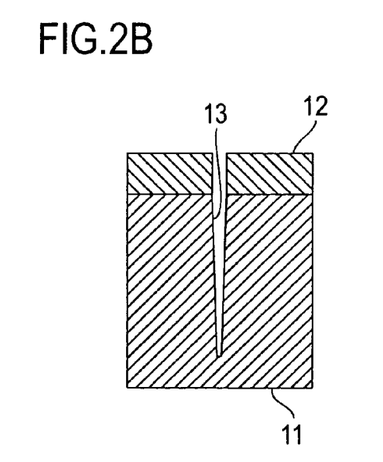
FIG. 2B is a sectional view showing the etching profile of a high aspect ratio by the method of FIG. 1.

With the method that provides sidewall protection during etching, it is possible to achieve vertical etching as referred to above, but the use of an ordinary ion beam allows the workpiece surface to become rough, and by the mechanism for coating the etching profile over the entire area of its surface with the protective film, the etching profile tends to taper off as the etching proceeds. In FIG. 1, steps S1 to S5 depict how the etching profile tapers off. In FIG. 1, reference numeral 11 denotes a substrate, 12 a mask, 13 a groove, and 14 a sidewall protective film. Such a taper-off tendency does not matter when the aspect ratio of the etching profile is small as shown in FIG. 2A, but it gives rise to a serious problem when the aspect ratio is large as shown in FIG. 2B, and in the fabrication of devices which calls for very high-precision etching, such as a photonic crystal device and the like.

Figure 3:
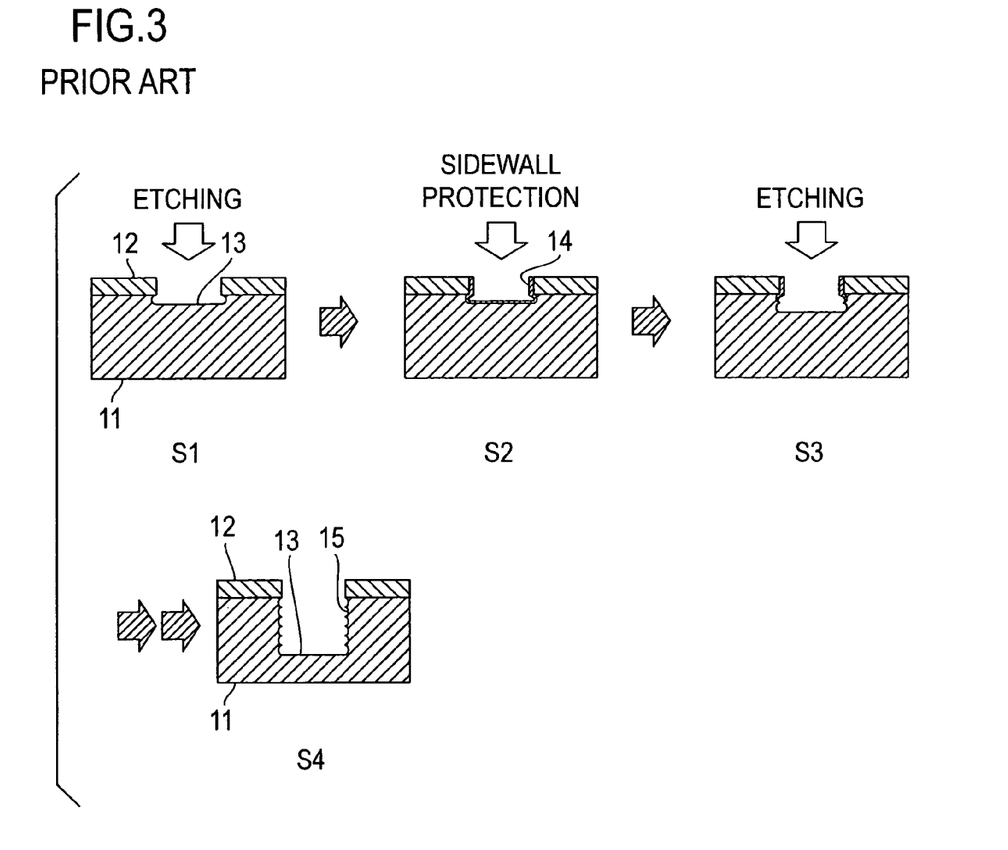
FIG. 3 shows in section a sequence of steps involved in another conventional etching method that uses a Bosch process.

With the Bosch process which alternately performs etching and deposition of the sidewall protective film, the etching scheme is designed so that the sidewall 15 of the groove 13 just underlying the marginal edge of the mask 12 is also etched away as depicted in steps S1 to S4 in FIG. 3, by which it is possible to prevent the groove 13 from tapering off; however, a structure called "scallop" is formed on the sidewall 15 of the groove 13 as shown in step S4 in FIG. 3—this produces the serious problem of increased surface roughness of the sidewall 15.

For the reasons given above, such a plasma etching method combined with the "sidewall protection" scheme cannot be used to manufacture devices which require a large aspect ratio, high precision and low roughness, such as photonic crystal devices required to have an average surface roughness Ra on the order of 0.1 nm.

On the other hand, Documents 7, 1 and 2 describe the use of the cluster ion beam that enables planar ultraprecision polishing of the workpiece surface in terms of atomic size and the use of the cluster ion beam for etching that permits reduction of damage to the workpiece surface, as referred to previously, but these documents indicate only the reducibility of the surface roughness of the workpiece by use of the cluster ion beam and make no mention of the workability of vertical etching and the sidewall surface roughness. In other words, no studies have been made of an etching method for microfabrication of devices with a large aspect ratio, high precision and low roughness.

SUMMARY OF THE INVENTION

It is therefore an object of the present invention to provide a dry etching method that ensures high-precision machining with a high aspect ratio and permits reduction of the sidewall surface roughness of an etching profile.

According to a first aspect of the present invention, there is provided a dry etching method in which clusters formed by agglomeration of atoms or molecules are ionized and accelerated to form a cluster ion beam for irradiation of the surface of an object to etch away constituent atoms of the object surface, wherein: the clusters are mixed clusters formed by agglomeration of two or more kinds of atoms or molecules; and the mixed clusters each contain atoms of at least one of argon (Ar), neon (Ne), xenon (Xe) and krypton (Kr), and a component that is deposited on the object surface to form a thin film by reaction therewith.

According to a second aspect of the present invention, there is provided a dry etching method in which clusters formed by agglomeration of atoms or molecules are ionized and accelerated to form a cluster ion beam for irradiation of the surface of an object to etch away constituent atoms of the object surface, wherein: the clusters are mixed clusters formed by agglomeration of two or more kinds of atoms or molecules; and the mixed clusters each contain a component that forms a volatile reaction product by reaction with the object surface, and a component that is deposited on the object surface to form a thin film by reaction therewith.

According to a third aspect of the present invention, there is provided a dry etching method in which two or more kinds of clusters of different constituent atomic species or molecular species are independently ionized and accelerated to form cluster ion beams for simultaneous or alternate irradiation of the surface of an object to etch away constituent atoms of the object surface, wherein: at least one kind of cluster is composed of atoms of any one of argon (Ar), neon (Ne), xenon (Xe) and krypton (Kr); and at least another kind of cluster contains a component that is deposited on the object surface to form a thin film by reaction therewith.

According to a fourth aspect of the present invention, there is provided a dry etching method in which two or more kinds of clusters of different constituent atomic species or molecular species are independently ionized and accelerated to form cluster ion beams for simultaneous or alternate irradiation of the surface of an object to etch away constituent atoms of the object surface, wherein: at least one kind of cluster contains a component that forms a volatile reaction product by reaction with the object surface; and at least another kind of cluster contains a component that is deposited on the object surface to form a thin film by reaction therewith.

In the dry etching method according to the present invention which uses a cluster ion beam for irradiation of a specimen, the cluster ion beam is composed of mixed clusters that contain two kinds of atoms or molecules, one for etching and the other for forming a film on the sidewall of the etched structure; alternatively, clusters each containing one of the above-mentioned two kinds of atoms or molecules are used for simultaneous or alternate irradiation of the specimen. With such a method, it is possible to achieve minimization of the surface roughness of the sidewall and ultraprecision vertical etching.

DETAILED DESCRIPTION OF THE PREFERRED EMBODIMENT

Embodiments of the present invention will hereinafter be described with reference to the accompanying drawings.

Figure 4:
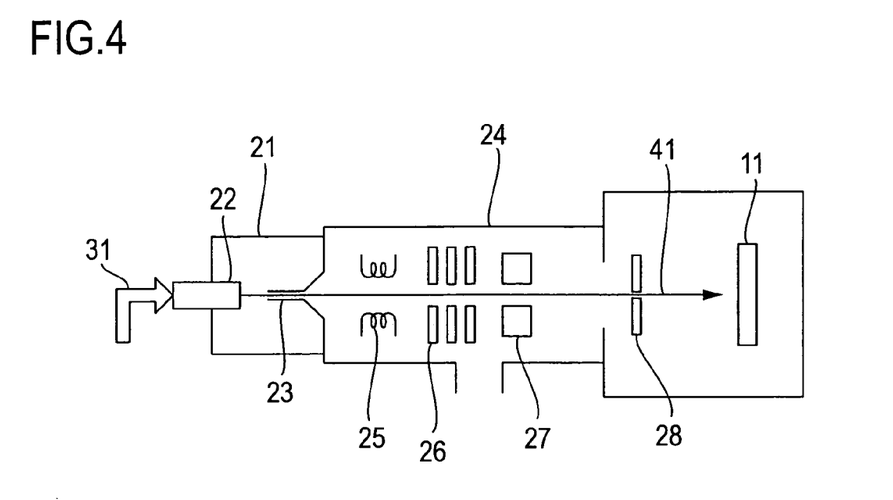
FIG. 4 is a schematic diagram illustrating the configuration of a cluster ion beam etching device for use in a first embodiment of the present invention.

FIG. 4 is a schematic showing of a cluster ion beam etching device for use in the present invention. A description will be given first, with reference to FIG. 4, of the processes of generation of a cluster ion beam and irradiation of a substrate (a specimen) with the cluster ion beam.

A gas 31 is introduced into a cluster forming chamber 21 via a nozzle 22, from which the gas is injected into a vacuum to aggregate gas molecules to form clusters. The clusters thus formed are guided as a neutral cluster beam through a skimmer 23 into an ionizing chamber 24, wherein the cluster beam is ionized by irradiation with an electron beam by an ionizer 25. The thus ionized cluster ion beam 41 is accelerated by an accelerator 26 for incidence on the surface of a substrate 11. Reference numeral 27 denotes a magnet, and 28 an aperture.

Figure 5:
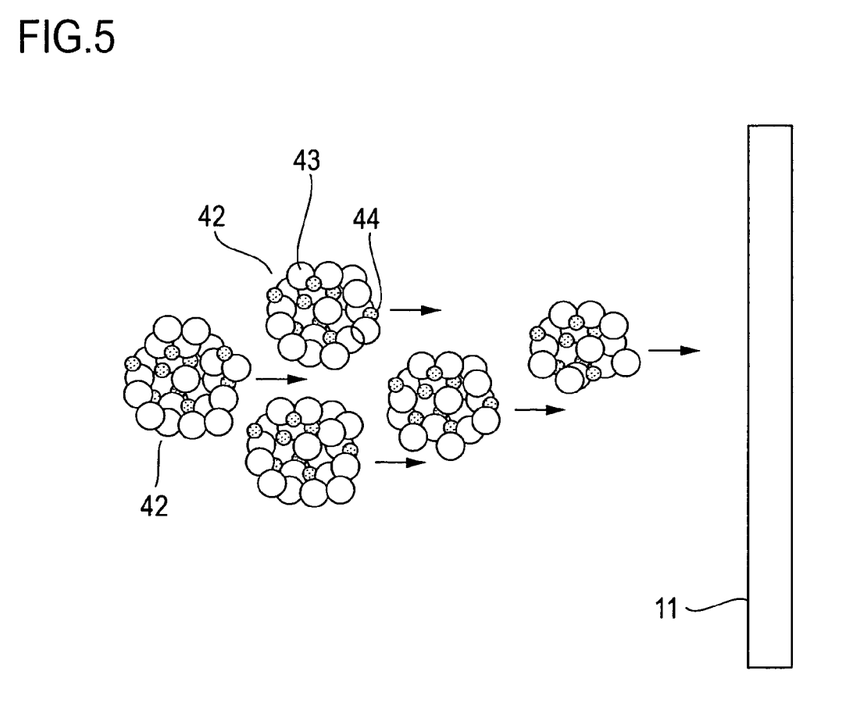
FIG. 5 is a schematic diagram depicting the mixed cluster beam used in the first embodiment.

In the illustrated example, the cluster formed as described above are mixed clusters formed by aggregation of two or more kinds of atoms or molecules, that is, the gas 31 that is introduced into the cluster forming chamber 21 is a mixture of two or more kinds of gases. FIG. 5 schematically depicts such mixed clusters, and in this example mixed clusters 42 are each composed of an atomic species (or molecular species)—1 and atomic species (or molecular species)—2. Reference numeral 43 denotes the atomic species (or molecular species)—1, and 44 the atomic species (or molecular species)—2.

The atomic species (or molecular species)—1 is at least one kind of atom selected from argon (Ar), neon (Ne), xenon (Xe), and krypton (Kr), and the atomic specifies (or molecular species)—2 is a component that reacts with the substrate surface to deposit thereon a thin film. The atomic species (or molecular species)—1 may also be a component that reacts with the substrate surface to form a volatile reaction product. That is, in this example the mixed gas is a mixture of an etching gas of the atomic species (or molecular species)—1 and a protective film (thin film) forming gas of the atomic species (or molecular species)—2.

Now, the principles and operation of the present invention will be described which uses, as the cluster ion beam, such mixed clusters as mentioned above.

It is known in the art that the irradiation of a specimen with the cluster ion beam substantially vertically to the specimen surface causes lateral sputtering. The lateral sputtering promotes smoothing or flattening of the specimen surface and hence permits reduction of the surface roughness. As is well-known in the art, however, in the case of forming, for example, a vertical groove in the specimen by the cluster ion beam, the sidewall surface of the groove is not flattened since no lateral sputtering takes place thereon.

Figure 6A:
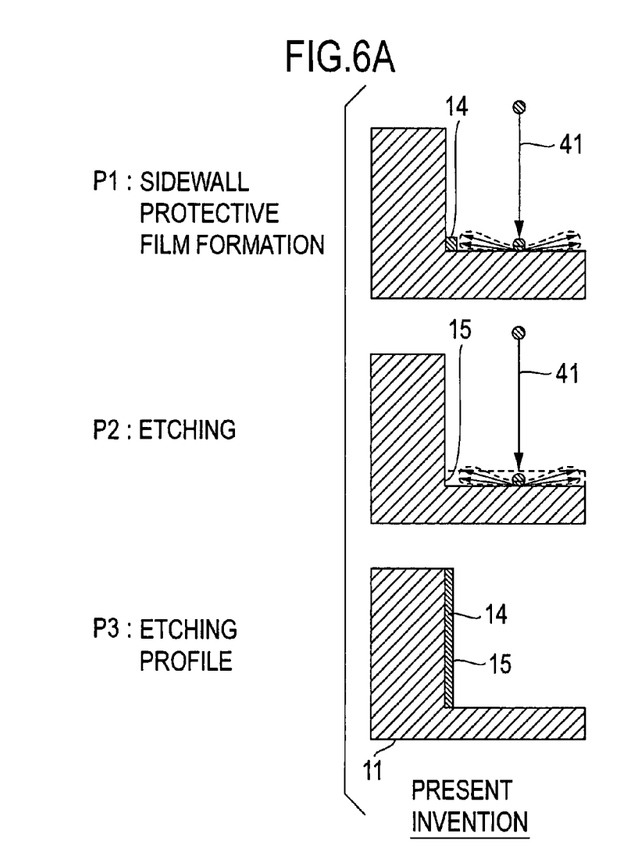
FIG. 6A is explanatory of the etching mechanism according to the present invention.

But the inventor of this application found out a phenomenon that when the energy of acceleration of the cluster ion beam 41 is high, the sidewall 15 near the bottom of the etching profile (that is, the workpiece) is also etched to provide markedly reduced surface roughness as shown in process P2 in FIG. 6A. The present invention makes good use of this phenomenon to provide a vertical etching profile with excellent verticality and small sidewall surface roughness.

Further, the inventor made an important discovery that the formation of the sidewall protective film 14 by the reaction between the clusters and the workpiece surface extremely smoothes the surface of the sidewall protective film 14 itself. This phenomenon will hereinafter be referred to as "lateral deposition," which is an application to the sidewall of a phenomenon that the ionized clusters or their particles bounce off the workpiece surface laterally by the effect of high-density irradiation with the clusters. The inventor speculates that the deposition of the sidewall protective film probably causes flattening or planarization of the film surface through the same kind of mechanism as that for lateral sputtering. The present invention combines the newly discovered phenomenon and the afore-mentioned cluster ion beam etching to ensure a radical reduction in the sidewall surface roughness and high verticality of the sidewall as shown in process P3 in FIG. 6A. Incidentally, since the actual ion beam contains not only components incident on the specimen surface perfectly at right angles thereto but also components incident on the surface at somewhat slight angles thereto, there is also the possibility that the irradiation of the protective-film-coated sidewall with the cluster ion beam further facilitates reduction of the surface roughness of the sidewall.

Figure 6B:
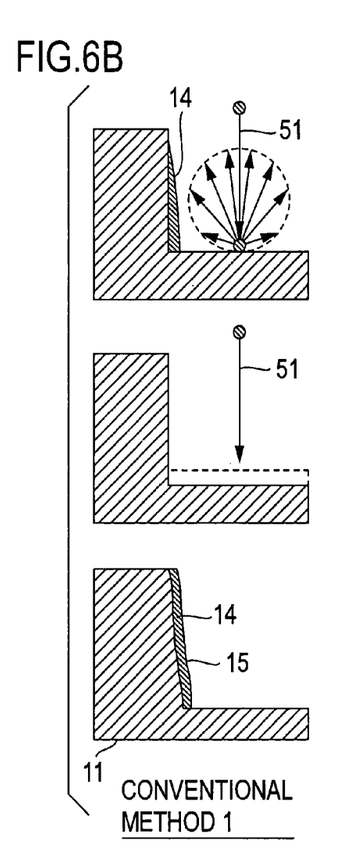
FIG. 6B is explanatory of the etching mechanism according to a conventional method.
Figure 6C:
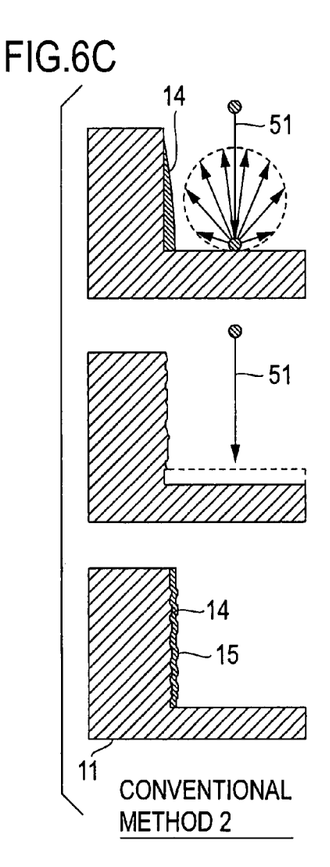
FIG. 6C is explanatory of the etching mechanism according to another conventional method.

In contrast thereto, the use of a monomer ion beam 51, not in cluster form, for the deposition of the sidewall protective film 14 introduces nonuniformity in the distribution of film thickness, degrading the verticality of the sidewall 15 as shown in FIG. 6B. Further, as depicted in FIG. 6C, since the irradiation with the monomer ion beam 51 does not bring about the lateral deposition characteristic of the cluster ion beam, the surface roughness of the sidewall protective film 14 increases, leading to an increase in the surface roughness of the sidewall 15.

As described above, the present invention is not a mere combination of prior techniques but is based on newly discovered phenomena, and the invention features the use of cluster ion beams for both of etching and the formation of the sidewall protective film.

Embodiment 1

This embodiment used the cluster ion beam etching device shown in FIG. 4, and used argon (Ar) as an etching gas and a $CHF_3$ gas as a component that reacts with an object surface to deposit and form a thin film. The Ar gas and the $CHF_3$ gas were mixed in a flow rate (mole ratio) of 9:1, then the mixed gas was introduced into the cluster forming chamber 21, from which it was injected via the nozzle 22 to obtain mixed clusters 42. The material of the substrate 11 subject to etching was silicon (Si). The silicon substrate 11 was irradiated with the mixed cluster ion under the condition of a 30 kV acceleration voltage. On the silicon substrate 11 there was preformed a line-and-space pattern by a nickel (Ni) mask. The silicon substrate 11 was irradiated with the cluster ion beam 41 until the depth of etching reached 10 μm.

Figure 7:
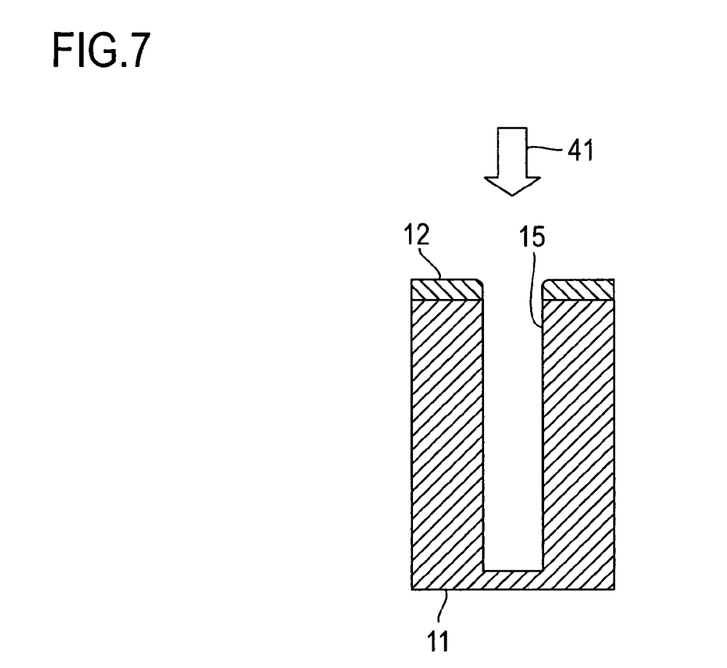
FIG. 7 is a sectional view showing the etching profile by the first embodiment.

For the evaluation of the etching profile, the verticality of the sidewall was evaluated using a scanning electron microscope (SEM) and the sidewall roughness was evaluated using an atomic force microscope (AFM). As a result, it was found that an etching profile with a vertical sidewall free from hollows or micro-trenches as shown in FIG. 7 was obtained. It was also found that the sidewall 15 was deposited with a carbon-polymerized film. The surface roughness of the sidewall 15 coated with the carbon-polymerized film was 0.12 nm in terms of the average roughness Ra. The sidewall protective film was removed by oxygen ashing, after which the surface roughness of the sidewall was measured. The surface roughness of the sidewall 15 was 0.10 nm in terms of the average roughness Ra. The verticality of the sidewall 15 was 90.00±0.08°.

Embodiment 2

Figure 8:
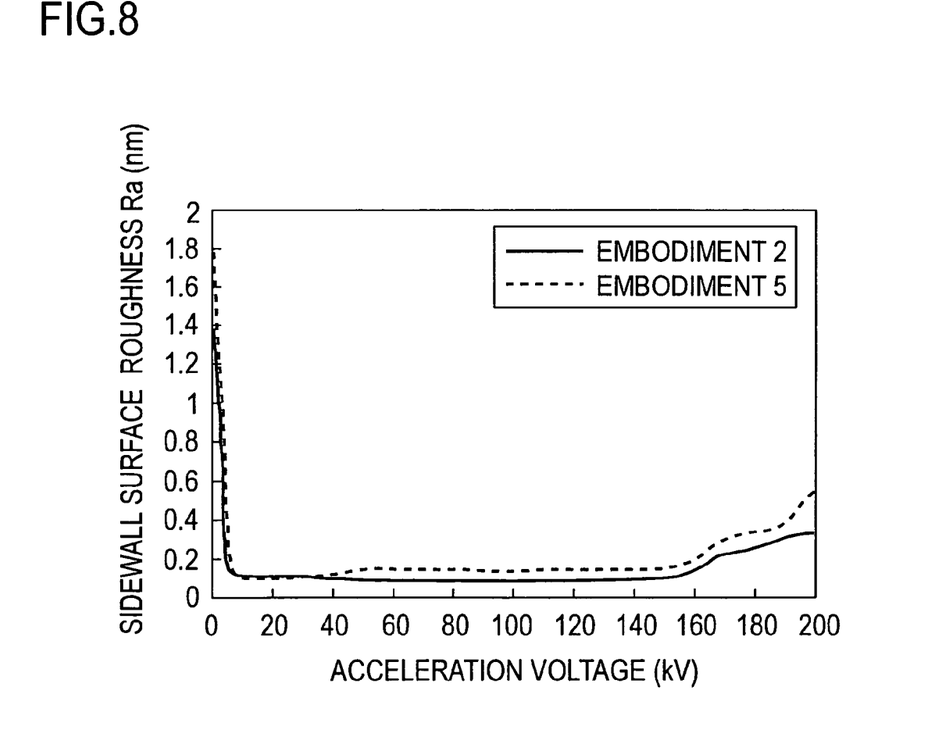
FIG. 8 is a graph showing the dependence of the sidewall surface roughness on acceleration voltage in second and fifth embodiments of the present invention.

This embodiment was implemented under basically the same conditions as in Embodiment 1 except changing the acceleration voltage for the mixed cluster ion beam. The acceleration voltage was varied from 0.5 kV to 200 kV. The surface roughness of the sidewall 15 was evaluated using AFM. The results of evaluation are shown in FIG. 8.

Embodiment 3

Figure 9:
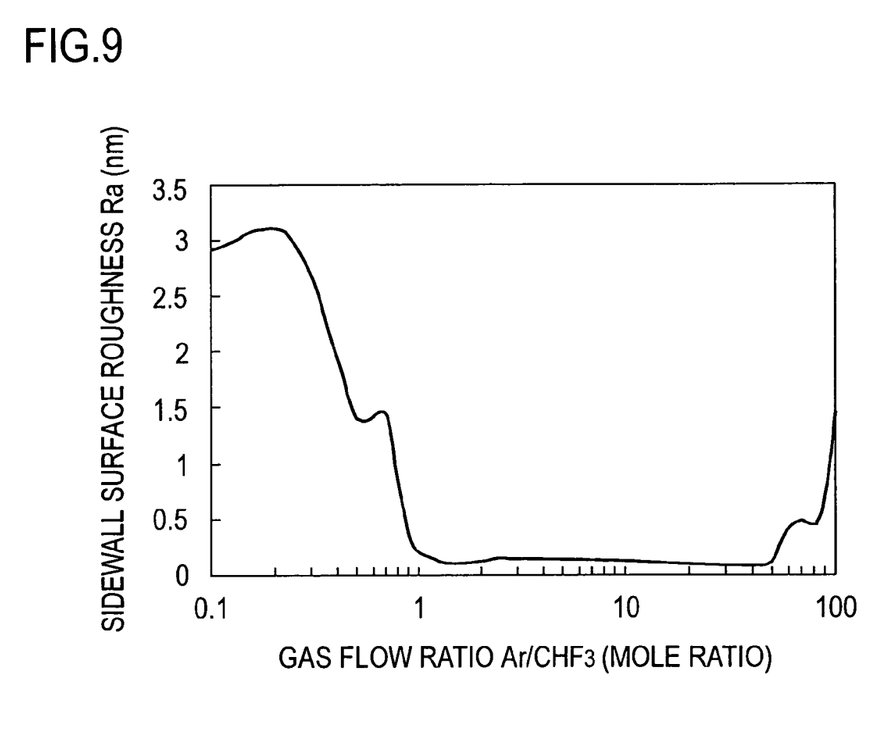
FIG. 9 is a graph showing the dependence of the sidewall surface roughness on the mixture gas ratio in a third embodiment of the present invention.

This embodiment was implemented under basically the same conditions as in Embodiment 1 except changing the flow rate between the Ar gas and th $CHF_3$ gas. The flow rate, $Ar/CHF_3$, was varied from 0.1 to 100. The surface roughness of the sidewall 15 was evaluated using AFM. The results of evaluation are shown in FIG. 9.

Embodiment 4

This embodiment was also implemented under basically the same conditions as in Embodiment 1 except the use of different kinds of etching gases, protective film forming gases and substrate materials. The etching gases used are Ar, Ne, Xe, Kr, and a halogen gas which reacts with the substrate surface to form a volatile reaction product. The protective film forming gases used are carbon fluorides ($CHF_3$, $C_4F_8$, $CF_4$) and $CHCl_3$. The results of evaluation of the surface roughness of the sidewall and its verticality are shown below in Table 1.

TABLE 1

| Etching Gas | Protective Film Forming Gas | Material of Substrate to be Etched | Sidewall Surface Roughness (nm) | Verticality of Etching Profile (degree) |
|---|---|---|---|---|
| Ne | $CHF_3$ | Si | 0.12 | 90.00 ± 0.10 |
| Xe | $CHF_3$ | Si | 0.14 | 90.00 ± 0.11 |
| Kr | $CHF_3$ | Si | 0.11 | 90.00 ± 0.10 |

TABLE 1-continued

| Etching Gas | Protective Film Forming Gas | Material of Substrate to be Etched | Sidewall Surface Roughness (nm) | Verticality of Etching Profile (degree) |
|---|---|---|---|---|
| Ar | $C_4F_8$ | Si | 0.10 | 90.00 ± 0.13 |
| Ar | $CF_4$ | Si | 0.10 | 90.00 ± 0.10 |
| $SF_6$ | $CHCl_3$ | Si | 0.18 | 90.00 ± 0.21 |
| $SF_6$ | $CHF_3$ | Si | 0.10 | 90.00 ± 0.11 |
| $Cl_2$ | $CHF_3$ | Si | 0.15 | 90.00 ± 0.16 |
| $Br_2$ | $CHF_3$ | Si | 0.14 | 90.00 ± 0.13 |
| $SF_6$ | $CHF_3$ | $SiO_2$ | 0.09 | 90.00 ± 0.10 |
| $SF_6$ | $CHF_3$ | SiN | 0.13 | 90.00 ± 0.19 |
| $SF_6$ | $CHF_3$ | SiC | 0.16 | 90.00 ± 0.16 |
| $SF_6$ | $CHF_3$ | GaAs | 0.23 | 90.00 ± 0.22 |
| $SF_6$ | $CHF_3$ | Ta | 0.22 | 90.00 ± 0.18 |
| $SF_6$ | $CHF_3$ | Au | 0.21 | 90.00 ± 0.14 |

Embodiment 5

This embodiment used, as the etching gas, $SF_6$ used in Embodiment 4 and $CHF_3$ as the protective film forming gas, and was implemented under basically the same conditions as in Embodiment 1 except changing the acceleration voltage for the mixed cluster ion beam. The acceleration voltage was varied from 0.5 kV to 200 kV. Th results of evaluation of the surface roughness of the sidewall 15 are shown in FIG. 8.

Embodiment 6

Figure 10:
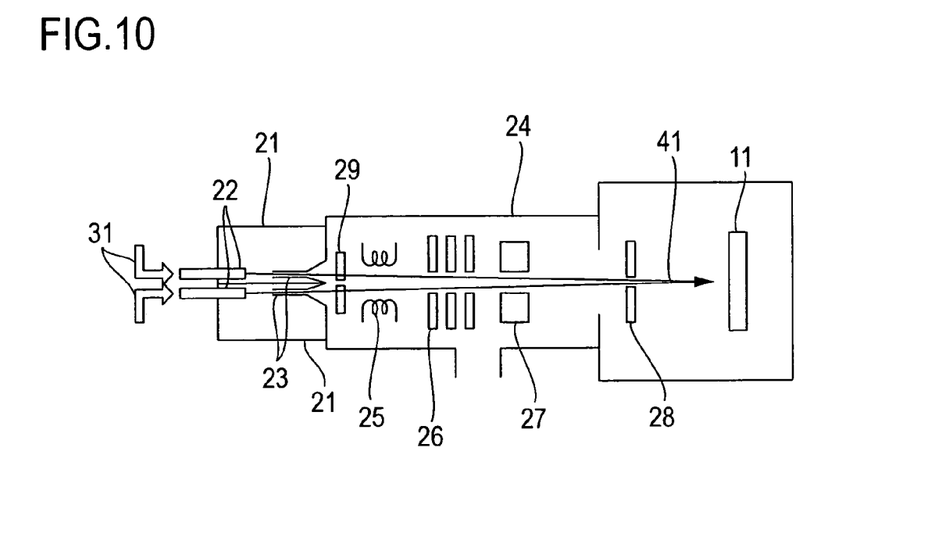
FIG. 10 is a schematic diagram illustrating the configuration of a cluster ion beam etching device for use in sixth and seventh embodiments of the present invention.

The etching device shown in FIG. 4 was partly modified to obtain a cluster ion beam etching device provided with two cluster forming chambers 21 as depicted in FIG. 10. In the two cluster forming chambers 21 $SF_6$ clusters and $CHF_3$ clusters were formed independently of each other. The two kinds of cluster beams were introduced into the common ionizing chamber 24 to generate $SF_6$ and $CHF_3$ cluster ions. A mixed cluster ion beam containing the two kinds of $SF_6$ and $CHF_3$ cluster ions at a 9:1 current rate (the rate between the numbers of both cluster ions) was accelerated by a 30 kV voltage for irradiation of the surface of the silicon substrate. After the silicon substrate was irradiated with the cluster ion beam until etching reached to a depth of 10 μm, the same evaluations as in Embodiment 1 were made. The surface roughness of the sidewall was 0.08 nm in terms of the average roughness Ra. The sidewall verticality was 90.00±0.11°.

Figure 11:
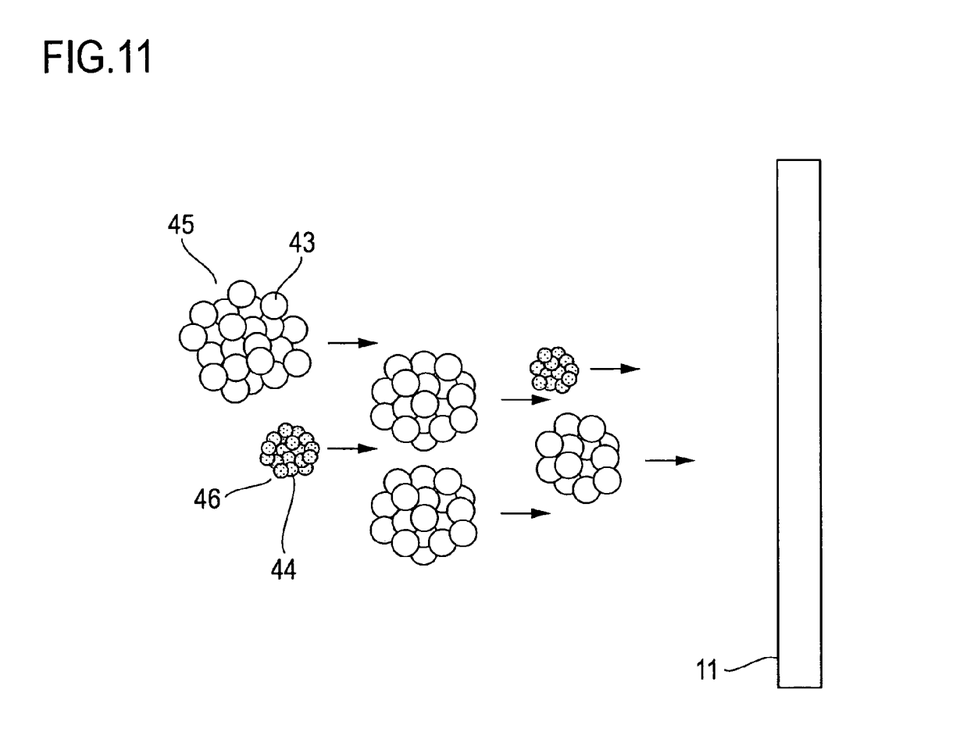
FIG. 11 is a schematic diagram showing a mixed cluster beam in the sixth embodiment.

FIG. 11 schematically illustrates mixed clusters composed of the two kinds of clusters. The cluster 45 is composed of a single atomic species (or molecular species)—1, whereas the cluster 46 is composed of a single atomic species (or molecular species)—2. In this example, these clusters 45 and 46 are the $SF_6$ cluster and the $CHF_3$ cluster, respectively.

Embodiment 7

The device of FIG. 10 was used, and a shatter 29 was opened and closed to irradiate the substrate 11 with two kinds of cluster beams alternately with each other. In the two cluster forming chambers 21 the $SF_6$ and $CHF_3$ clusters were formed independently of each other. An electron beam for ionization use was emitted in pulse form, and the shutter 29 was controlled in ganged elation to the generation of the pulses to ionize the $SF_6$ clusters and the $CHF_3$ clusters alternately with each other. The two kinds of thus ionized clusters were accelerated by a 30 kV voltage and alternately directed to the silicon substrate surface. The periods of irradiation with the $SF_6$ cluster ion beam and the $CHF_3$ cluster ion beam were 9 sec and 1 sec, respectively. After the silicon substrate was irradiated with the cluster ion beams until etching reached to a depth of 10 μm, the same evaluations as in Embodiment 1 were made. The surface roughness of the sidewall was 0.08 nm in terms of the average roughness Ra. The sidewall verticality was 90.00±0.10°.

Figure 12A:
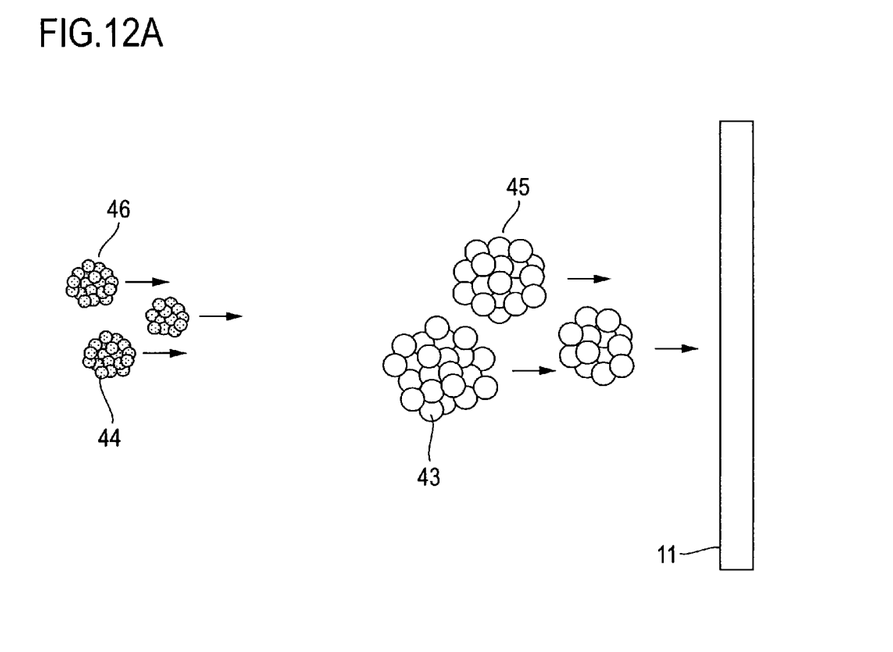
FIG. 12A is a schematic diagram showing two kinds of cluster beams for alternate irradiation in the seventh embodiment.
Figure 12B:
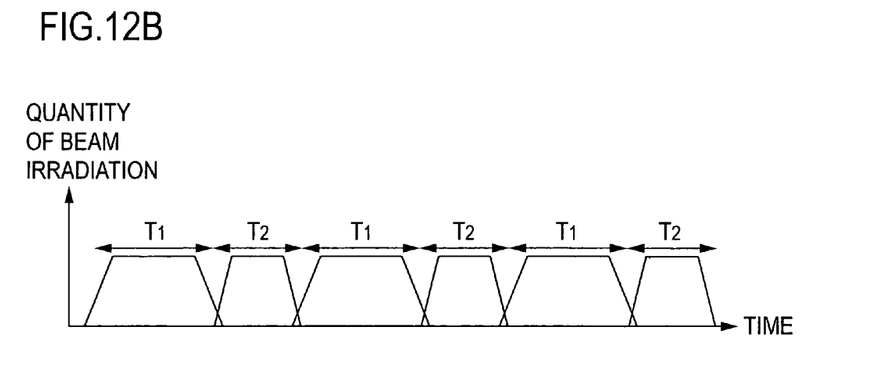
FIG. 12B is a diagram showing alternate irradiation with the cluster beams in FIG. 12A.

FIG. 12A is a diagram, similar to FIG. 11, schematically showing alternate irradiation of the substrate with such two kinds of cluster ion beams as mentioned above. FIG. 12B shows alternate irradiation with the two kinds of clusters 45 and 46. In FIG. 12B, $T_1$ indicates the time of irradiation with the clusters 45 (in this example, $SF_6$ clusters) for etching, and $T_2$ indicates the time of irradiation with the clusters 46 for the formation of the sidewall protective film (in this example, $CHF_3$).

COMPARATIVE EXAMPLE 1

Figure 13:
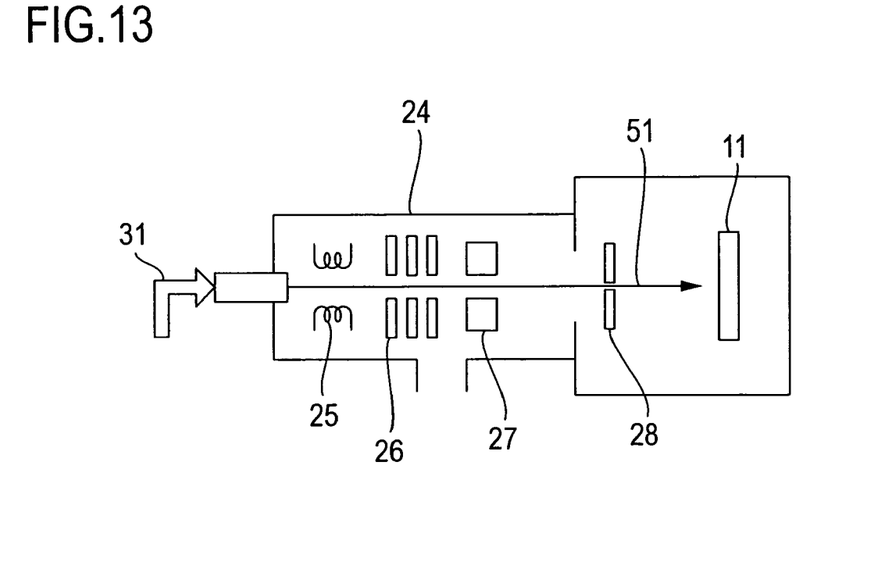
FIG. 13 is a schematic diagram depicting the configuration of the conventional ion beam etching device used in comparative example 1.

For comparison with the present invention, an experiment was conducted on the conventional ion beam etching scheme using a monomer ion beam not in the form of clusters. The etching device used is schematically depicted in FIG. 13. The device is approximately identical in construction with the device used in Embodiment 1 except the exclusion therefrom of the cluster forming chamber 21. The experiment was carried out under substantially the same conditions as those in Embodiment 1 except that no cluster ion beam was used. Argon (Ar) was used as the etching gas, and $CHF_3$ was used as the component for deposition as a thin film on a specimen by reaction with the specimen surface. The Ar gas and the $CHF_3$ gas were mixed at a 9:1 flow rate (mole ratio), and the mixed gas was introduced into the ionizing chamber 24. The specimen to be etched was a silicon (Si) substrate 11. The silicon substrate 11 was irradiated with the mixed ion beam 51 (composed of Ar and $CHF_3$ ions) accelerated through the application of a voltage of 30 kV. On the substrate surface there was previously formed a line-and-space pattern or the like by use of a nickel (Ni) mask. The substrate 11 was subjected to irradiation with the mixed ion beam 51 until the depth of etching reached to 10 μm. The etching profile was evaluated in the same manner as in Embodiment 1. It was found that the sidewall was coated with a carbon-polymerized film. The surface roughness of the sidewall covered with the carbon-polymerized film was 2.57 nm in terms of the average roughness Ra. After the removal of the sidewall protective film by oxygen ashing, the surface roughness of the sidewall was 2.38 nm in terms of the average roughness Ra. The sidewall verticality was 90.00±2.86°.

COMPARATIVE EXAMPLE 2

Figure 14:
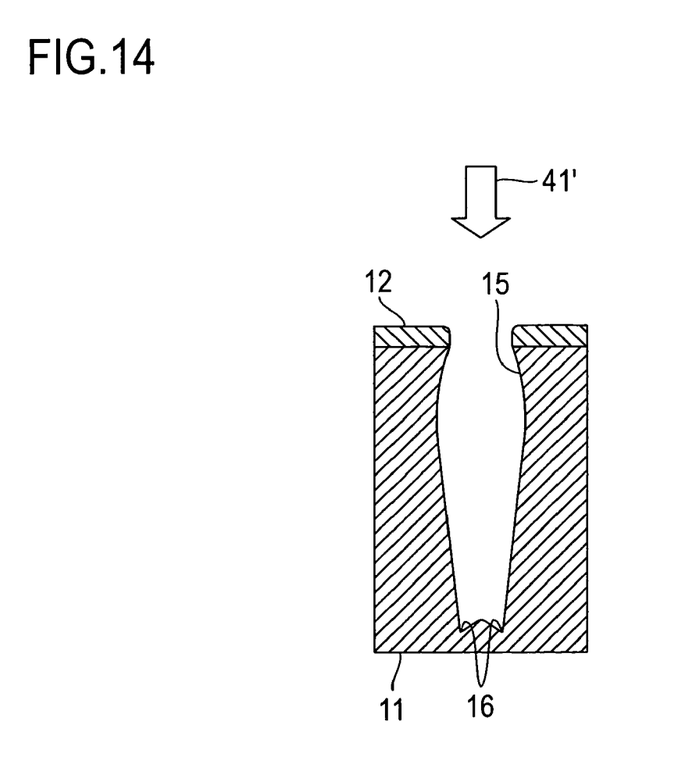
FIG. 14 is a sectional view showing an etching profile by comparative example 2.

An experiment was conducted under substantially the same conditions as in Embodiment 1 except that no mixed cluster beam was used. That is, the etching gas used was argon (Ar), but no component used for the formation of the thin film on the silicon substrate 11. The silicon substrate 11 was irradiated with a cluster ion beam 41' accelerated through the application of a voltage of 30 kV. On the substrate surface there was previously formed a line-and-space pattern or the like by use of a nickel (Ni) mask. The substrate 11 was subjected to irradiation with the cluster ion beam 41' until the depth of etching reached to 10 μm. The etching profile was evaluated in the same manner as in Embodiment 1. It was found that as etching proceeded, each sidewall 15 was somewhat hollowed out, then the groove tapered down, and small V-shaped grooves, called micro-trenches, were formed in the bottom of the etching profile as shown in FIG. 14. The surface roughness of the sidewall 15 was 3.65 nm in terms of the average roughness Ra, and the sidewall verticality was 90.00±4.29°.

The following is the facts that turn out from Embodiments 1 to 7 and Comparative Examples 1 and 2.

(1) From a comparison of Embodiment 1 with Comparative Example 1 it can be seen that mere mixing of the etching gas and the gas for the protection of the sidewall is not sufficient for etching but that the mixed gas needs to be rendered into clusters to provide reduced surface roughness of the sidewall and excellent sidewall verticality.

(2) From a comparison of Embodiment 1 with Comparative Example 2 it can be seen that mere irradiation with the cluster ion beam is not sufficient but that the component for deposition as a thin film on the specimen surface by reaction therewith needs to be used to provide reduced surface roughness of the sidewall and excellent sidewall verticality.

(3) Embodiment 2 reveals that too low an acceleration voltage for the cluster ion beam has no effect in reducing the surface roughness of the sidewall. An acceleration voltage of 5 kV or more is needed to provide markedly reduced sidewall surface roughness. Further, it is seen that an acceleration voltage above 150 kV somewhat impairs the surface roughness of the sidewall, but even such a high voltage brings about remarkably improved characteristics as compared with that by the conventional method (Comparative Example 1). The reason for this is that, as referred to previously, if the energy for accelerating the gas cluster ion beam is low, etching of the sidewall by the gas cluster ion beam is not so sufficient as to cause flattening of the sidewall and consequently reducing its surface roughness. This is a phenomenon discovered by the inventor for the first time. Conversely, if the beam accelerating energy is too high, the cluster ion beam penetrate deep into the surface portion of the specimen, resulting in a little increase in the surface roughness.

(4) Embodiment 3 indicates that the ratio between the etching gas component and the protective film forming component is optimum substantially in the range of 1:1 to 50:1. Taking into account the afore-mentioned etching mechanism, it is considered that the above-said range of gas mixing ratio is not limited specifically to the combination of Ar and the $CHF_3$ gases but may also be applied to the cases of using a different rare gas or halogen-based gas as a substitute for the argon.

(5) Embodiment 4 reveals that even if the etching gas, the protective film forming gas, the material of the substrate to be etched, and so on are changed over a wide range, an etching profile with reduced small surface roughness and excellent verticality of the sidewall is obtained. This is due to the combined use of the high-density irradiation effect characteristic of the clusters and the newly discovered sidewall flattening effect. Accordingly, it is important to use the cluster ion beam for both of etching and the formation of sidewall protective film, and various modifications can be made to the other conditions.

(6) Embodiment 5 is one that changed the cluster acceleration voltage as in Embodiment 2, and produces similar effects. Since this is considered to result from the mechanism that the energy of the cluster ion beam essentially contributes to the reduction of the surface roughness of the sidewall, the acceleration voltage dependence seems to remain unchanged no matter what gas composition may be used.

(7) From a comparison of Embodiments 6 and 7 with Embodiment 4 it is seen that that the dry etching, which removes constituent atoms of the specimen surface by simultaneous or alternate irradiation with the accelerated cluster ion beam composed of two or more kinds of clusters, reduces the surface roughness of the sidewall more than in the case of using the mixed clusters.

Next, a description will be given of conditions for fabricating a photonic crystal device by use of the dry etching method according to the present invention and evaluation of its optical characteristics.

The etching conditions were the same as in embodiment 1. The etching gas used is argon (Ar), and $CHF_3$ was used as the component that reacts with the specimen surface to form a thin film. The Ar gas and the $CHF_3$ gas are mixed in a flow rate (mole ratio) of 9:1, then the mixed gas was introduced into the cluster forming chamber, from which it was blown through a nozzle to obtain mixed clusters. The mixed cluster ion beam accelerated through the application of a voltage of 30 kV for irradiation of a silicon (Si) substrate.

For the photonic crystal device was used an SOI (Silicon On Insulator) wafer that had a 1-µm thick $SiO_2$ layer formed all over top surface of the silicon substrate and covered with a 10-µm thick silicon layer. The SOI wafer was coated with a resist, which was exposed by an electron beam exposure machine, followed by development, then by vapor deposition of nickel (Ni), and by the formation of an Ni mask by a lift-off method. Thereafter, the silicon layer was subjected to etching under the above-mentioned conditions.

Figure 15A:
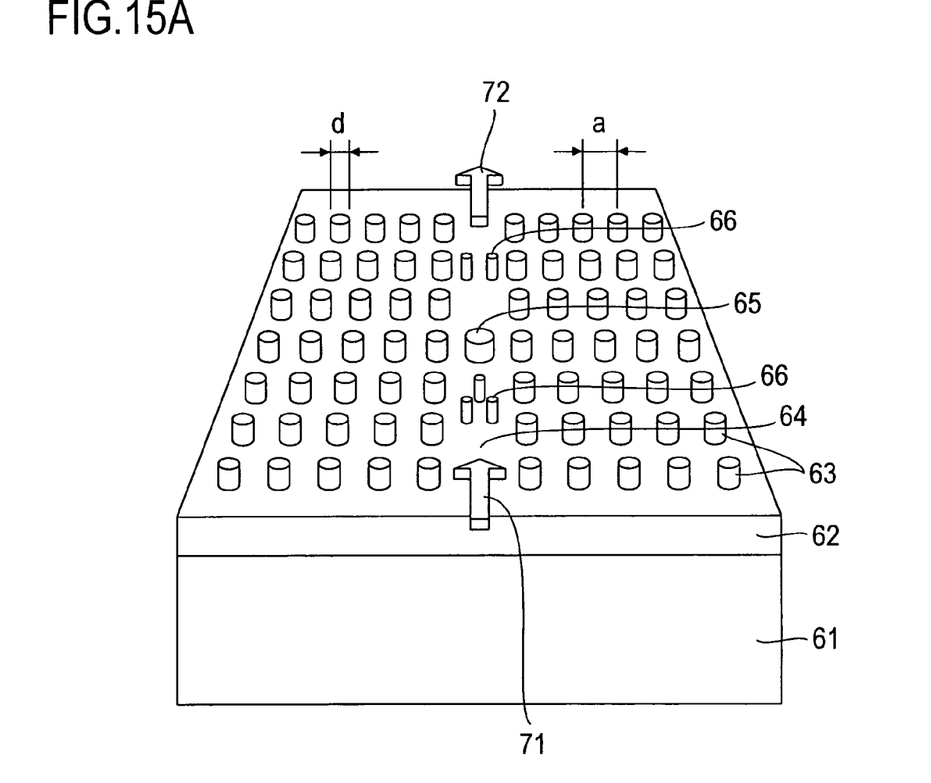
FIG. 15A is a perspective view schematically showing the structure of a photonic crystal device fabricated by the present invention.
Figure 15B:
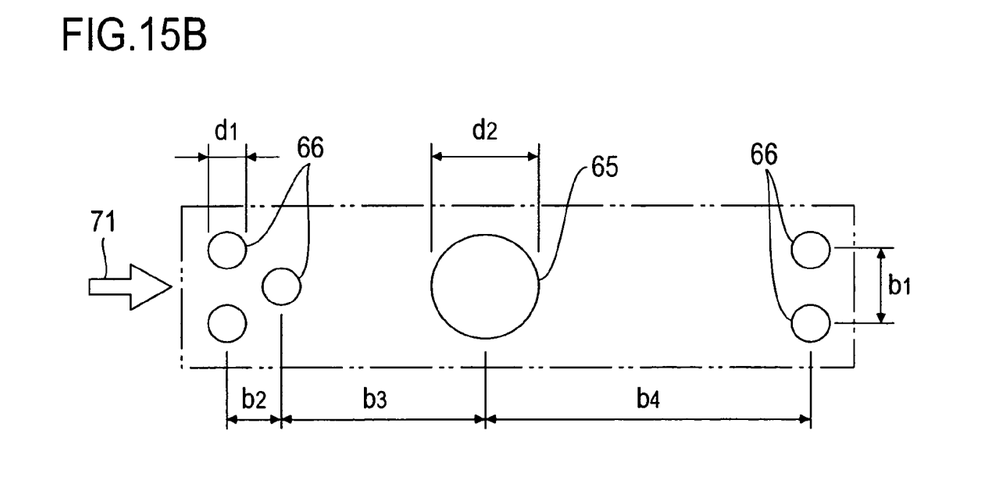
FIG. 15B is a partially enlarged diagram showing a resonator structure of the photonic crystal device in FIG. 15A.

FIG. 15A is a conceptual representation of a structure produced by etching. Reference numeral 61 denotes an silicon substrate, 62 a silicon dioxide ($SiO_2$) layer, and 63 columnar rods formed by selective etching of the silicon layer. In this example, the rods 63 are arranged in matrix (square lattice) form, but a waveguide 64 is formed by one missing one line of such rods 63 and a resonator is disposed in the waveguide 64. FIG. 15B schematically illustrates the resonator, which is composed of a main rod 65, three sub-rods 66 and two sub-rods 66 disposed at the light-incidence and the light-emitting side with respect to the main rod 65, respectively. In FIGS. 15A and 15B the arrow 71 indicates incident light and the arrow 72 light allowed to pass through the waveguide 64.

The rods 63 are each have a diameter d=0.2 µm and are arranged with a pitch a=0.5 am. The sizes of respective parts of the resonator are as follows:

The diameter $d_1$ of the sub-rod 66 is 0.1 µm; the diameter $d_2$ of the main rod 65 is 0.3 µm; and rod spacings $b_1$, $b_2$, $b_3$ and $b_4$ are 0.2 µm, 0.15 µm, 0.55 µm, and 0.9 µm, respectively.

The evaluation of the optical characteristics of the photonic crystal device was made by launching light of wavelengths 1.2 µm to 1.8 µm into the waveguide 64 with the resonator disposed therein and by monitoring light having transmitted therethrough. The transmitting light was measured for 10 samples of such photonic crystal devices, and variations (difference between maximum and minimum values) in the peak wavelength of the transmitting light were calculated; such variations were ±0.032 nm.

In general, filters for DWDM (Dense Wavelength Division Multiplexing) are required to hold the wavelength variation within ±0.05 nm. The above-mentioned value sufficiently meets the requirement—this indicates that the photonic crystal device according to the present invention is suitable for use in DWDM.

In the interests of comparison, similar photonic crystal devices were fabricated under the etching conditions referred to previously with respect to Comparative Example 1. The variations in the peak wavelength of transmitting light were ±0.68 nm. This revealed that the conventional etching method using the monomer ion beam is impossible to fabricate photonic crystal devices for DWDM use.

What is claimed is:

1. A dry etching method for processing a recess in a substrate that comprises:
    selecting at least one first gas from gases of a first group of atomic species or molecular species;
    selecting at least one second gas from gases of a second group of atomic species or molecular species;
    forming first clusters by agglomeration of constituent atoms or molecules of the selected at least one first gas;
    forming a beam of the first clusters;
    forming second clusters by agglomeration of constituent atoms or molecules of the selected at least one second gas;
    forming a beam of the second clusters concurrently with and independently of the forming of the beam of first clusters;
    forming a beam of mixed first cluster ions and second cluster ions by ionizing the beam of first cluster ions and the beam of second cluster ions concurrently; and
    accelerating and irradiating the beam of mixed first cluster ions and second cluster ions onto the substrate to form the recess in the substrate with a sidewall and a bottom surface.

2. A dry etching method for processing a recess in a substrate that comprises:
    selecting at least one first gas from gases of a first group of atomic species or molecular species;
    selecting at least one second gas from gases of a second group of atomic species or molecular species;
    forming first clusters by agglomeration of constituent atoms or molecules of the selected at least one first gas;
    forming a beam of the first clusters;
    forming second clusters by agglomeration of constituent atoms or molecules of the selected at least one second gas;
    forming a beam of the second clusters concurrently with and independently of the forming of the beam of first clusters;
    forming an alternating beam of cluster ions comprising beams of the first cluster ions alternating with beams of the second cluster ions by alternately ionizing the beam of first clusters and the beam of second clusters; and
    accelerating and irradiating die alternating beam of cluster ions onto the substrate to form the recess in substrate with a sidewall and a bottom surface.

3. The method according to claim 1 or 2, wherein said reactive gases are halogens.

4. The method according to claim 1 or 2, wherein said protective reaction product forming gases are selected from a group consisting of carbon fluoride and CHCl3.

5. The method according to claim 4, wherein said carbon fluoride is selected from a group consisting of CHF3 and C4F8.

6. The method according to claim 1 or 2, wherein said substrate is a silicon-containing material.

7. The method according to claim 1 or 2, wherein an acceleration voltage that accelerates said cluster ions is greater than 5 kV.

8. The method according to claim 1 or 2, wherein a volume ratio between the selected gases from said first and second groups is set within 1:1 to 50:1.

9. The method according to claim 1 or 2, wherein said inert gases are selected from the group consisting of argon (Ar), neon (Ne), xenon (Xe) and krypton (Kr).

10. The method according to claim 1 used in an etching device that comprises:

a first cluster forming chamber having a first nozzle and a first skimmer, a second cluster forming chamber having a second nozzle and a second skimmer, and an ionizing chamber connected via the first skimmer to the first cluster forming chamber and connected via the second skimmer to the second cluster forming chamber, wherein the ionizing chamber comprises an ionizer and an accelerator, and contains a substrate, and wherein the method comprises:

forming the first clusters by injecting the selected at least one first gas via the first nozzle into the first cluster forming chamber;

forming the second clusters by injecting die selected at least one second gas via the second nozzle into the second cluster forming chamber;

forming the beam of first clusters by injecting the first clusters via the first skimmer into the ionizing chamber;

forming the beam of second clusters by injecting the second clusters via the second skimmer into the ionizing chamber;

forming the beam of mixed first cluster ions and second cluster ions by supplying the beam of first clusters and the beam of the second clusters concurrently to the ionizer; and accelerating and irradiating the beam of mixed first cluster ions and second cluster ions onto the substrate by using the accelerator.

11. The method according to claim 2 used in an etching device that comprises:

a first cluster forming chamber having a first nozzle and a first skimmer, a second cluster forming chamber having a second nozzle and a second skimmer, and an ionizing chamber connected via the first skimmer to the first cluster forming chamber and via the second skimmer to the second cluster forming chamber, wherein the ionizing chamber comprises a shutter, an ionizer and an accelerator, and contains a substrate, and wherein the method comprises:

forming the first clusters by injecting the selected at least one first gas via the first nozzle into the first cluster forming chamber;

forming the second clusters by injecting the selected at least one second gas via the second nozzle into the second cluster forming chamber;

forming the beam of first clusters by injecting the first clusters via the first skimmer into the ionizing chamber;

supplying the beam of first clusters to the shutter;

forming the beam of second clusters by injecting the second clusters via the second skimmer into the ionizing chamber;

supplying the beam or second clusters to the shutter concurrently with and independently of supplying the beam of first clusters to the shutter alternately ionizing the beam of first clusters and the beam of second clusters by switching the shutter to supply the beam of first clusters and the beam of second clusters alternately to the ionizer; and accelerating and irradiating the alternating beam of cluster ions onto the substrate by using the accelerator.

12. The method according to claim 1 or 10, wherein:

the gases of the first group of atomic species or molecular species are inert gases;

the gases of the second group of atomic species or molecular species are protective reaction product forming gases that form by reaction with constituent atoms of said substrate a non-volatile protective reaction product; and the sidewall of the recess is smoothed to have a surface roughness of 0.23 nm or less due to lateral sputtering of the constituent atoms of the substrate caused by irradiation of the first cluster ions onto the bottom surface of the recess in the substrate and due to lateral deposition of the non-volatile protective reaction product onto the sidewall caused by irradiation of the second cluster ions onto the bottom surface of the recess in the substrate.

13. The method according to claim 1 or 10, wherein:

the gases of the first group of atomic species or molecular species are reactive gases that form a volatile reaction product by reaction with constituent atoms of the substrate;

the gases of the second group of atomic species or molecular species are protective reaction product forming gases that form by reaction with constituent atoms of said substrate a non-volatile protective reaction product; and the sidewall of the recess is smoothed to have a surface roughness of 0.23 nm or less due to lateral sputtering of the constituent atoms of the substrate caused by irradiation of the first cluster ions onto the bottom surface of the recess in the substrate and due to lateral deposition of the non-volatile protective reaction product onto the sidewall caused by irradiation of the second cluster ions onto the bottom surface of the recess in the substrate.

14. The method according to claim 13, wherein said beam of the mixed first and second cluster ions is formed by selecting a current rate of 9:1 between the first and second cluster ions.

15. The method according to claim 2 or 11, wherein:

the gases of the first group of atomic species or molecular species are inert gases;

the gases of die second group of atomic species or molecular species are protective reaction product forming gases that form by reaction with constituent atoms of said substrate a non-volatile protective reaction product; and the sidewall of the recess is smoothed to have a surface roughness of 0.23 nm or less due to lateral sputtering of the constituent atoms of the substrate caused by irradiation of the first cluster ions onto the bottom surface of the recess in the substrate and due to lateral deposition of the non-volatile protective reaction product onto the sidewall caused by irradiation of the second cluster ions onto the bottom surface of the recess in the substrate.

16. The method according to claim 2 or 11, wherein:

the gases of the first group of atomic species or molecular species are reactive gases that form a volatile reaction product by reaction with constituent atoms of the substrate;

the gases of the second group of atomic species or molecular species are protective reaction product forming gases that form by reaction with constituent atoms or said substrate a non-volatile protective reaction product; and the sidewall of the recess is smoothed to have a surface roughness of 0.23 nm or less due to lateral sputtering of the constituent atoms of the substrate caused by irradiation of the first cluster ions onto the bottom surface of the recess in the substrate and due to lateral deposition of the non-volatile protective reaction product onto the sidewall caused by irradiation of the second cluster ions onto the bottom surface of the recess in the substrate.

* * * * *